United States Patent [19]

Carter

[11] 4,160,213

[45] Jul. 3, 1979

[54] MIXER INJECTION VOLTAGE COMPENSATION CIRCUIT

[75] Inventor: George W. Carter, Greenfield, Ind.

[73] Assignee: RCA Corporation, New York, N.Y.

[21] Appl. No.: 837,780

[22] Filed: Sep. 29, 1977

[51] Int. Cl.² .............................................. H04B 1/26
[52] U.S. Cl. .................................... 325/439; 325/453; 325/490
[58] Field of Search ............... 325/438, 439, 451, 452, 325/453, 488, 490; 331/40, 109, 182

[56] References Cited

U.S. PATENT DOCUMENTS

| | | | |
|---|---|---|---|
| 2,905,814 | 9/1959 | Huebscher | 325/439 |
| 3,348,154 | 10/1967 | Fish, Jr. et al. | 325/439 |
| 3,408,576 | 10/1968 | Ghaem-Maghami | 325/439 |
| 3,794,924 | 2/1974 | Furuya et al. | 325/439 |
| 3,825,858 | 7/1974 | Amemiya et al. | 334/15 |
| 3,976,944 | 8/1976 | Kreng et al. | 325/439 |

OTHER PUBLICATIONS

IEEE Transactions on Consumer Electronics –"New VHF and UHF Varactor Tuners" –G. W. Carter, Aug. 1976, vol. CE-22 #3, pp. 203-209.

Primary Examiner—Robert L. Griffin
Assistant Examiner—Marc E. Bookbinder
Attorney, Agent, or Firm—Eugene M. Whitacre; Paul J. Rasmussen; Peter M. Emanuel

[57] ABSTRACT

In a VHF tuner for a television receiver including a varactor controlled local oscillator (LO), a field effect transistor (FET), arranged as a mixer for generating an IF signal in response to RF and local oscillator signals, is biased with respect to the amplitude of the local oscillator signal corresponding to channel 6 to inhibit the development of intermodulation and cross-modulation products which tend to manifest themselves at channel 6 and to provide a suitably large conversion gain at channel 6. A varactor diode is coupled in serial fashion between the varactor controlled LO and the FET and is controlled in response to the tuning voltage, normally utilized to control the frequency of oscillation of the LO, to couple signals to the FET from the LO having approximately the same amplitude as the amplitude of the signal coupled to the FET from the LO at channel 6 throughout the low VHF band including channels 2–6 so as to substantially maintain the combination of desired mixer bias and mixer input signal throughout the low VHF band.

6 Claims, 1 Drawing Figure

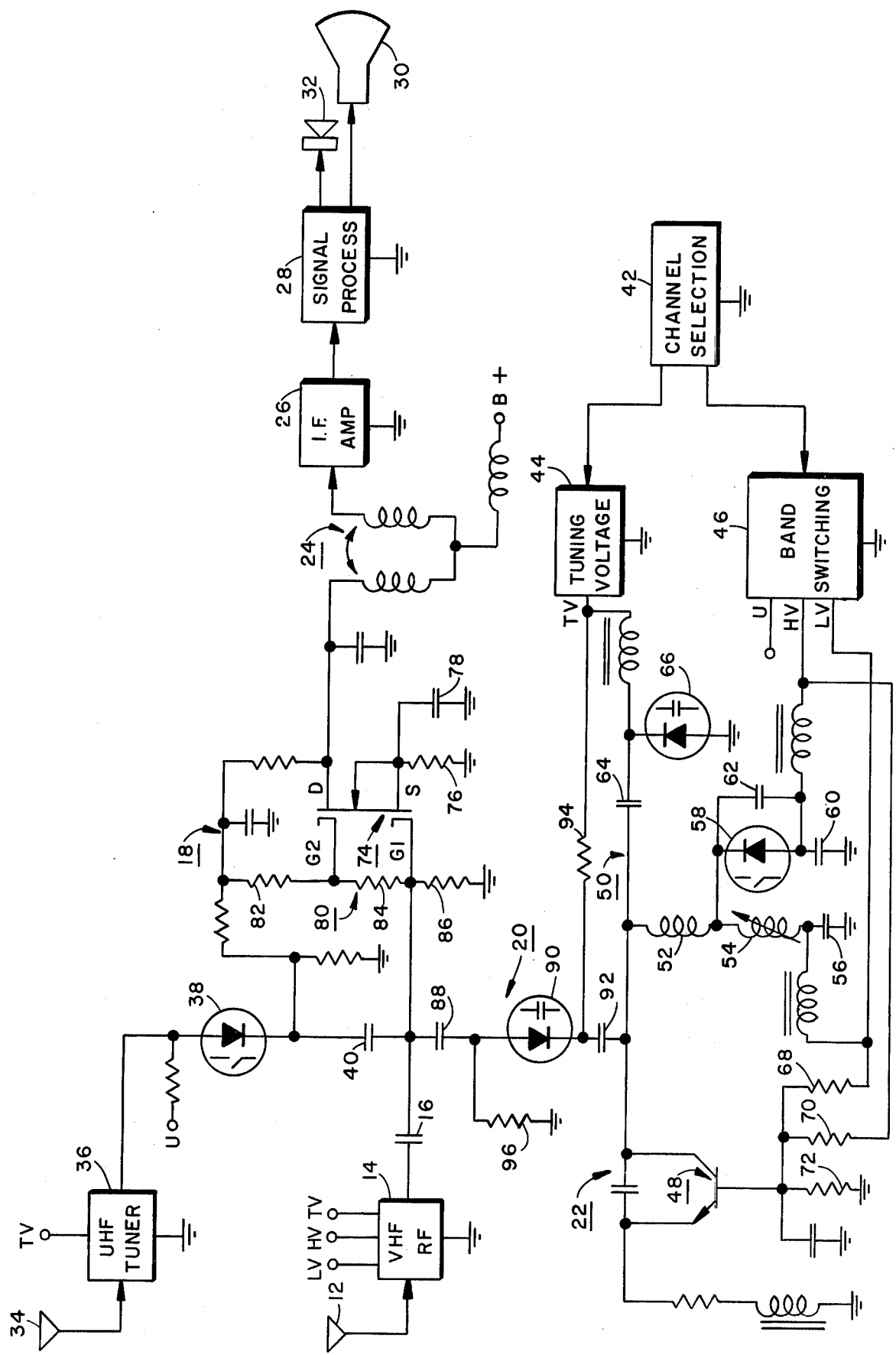

MIXER INJECTION VOLTAGE COMPENSATION CIRCUIT

BACKGROUND OF THE INVENTION

The present invention is related to the field of tuners for use in television receivers and the like including a mixer for combining RF carriers and corresponding local oscillator signals generated by a voltage controlled oscillator to produce an IF signal.

Many types of mixer circuits including a bipolar transistor as the mixing device are known. However, recently mixer circuits including a field effect transistor (FET) as the mixing device have been proposed because an FET exhibits a more nearly square law transfer characteristic than a bipolar transistor. As a result, an FET mixer tends to generate fewer undesirable cross-modulation and intermodulation products than a bipolar transistor mixer.

Unfortunately, although an FET mixer exhibits a more nearly square law transfer characteristic than a bipolar mixer, an FET mixer tends to have a lower conversion gain than a bipolar transistor. The conversion gain of an FET mixer is dependent not only on the bias conditions of the FET, but also on the amplitudes of the local oscillator signals coupled to it. Unfortunately, when a voltage controlled oscillator utilizing a varactor diode is utilized in conjunction with an FET mixer, it is not generally possible to ensure the desired local oscillator signal amplitude for an acceptable conversion gain throughout the entire frequency range of the local oscillator signals since the local oscillator signals tend to exhibit relatively large amplitude variations throughout their frequency range.

To remedy this undesirable situation, it has been proposed to vary the DC operating point of an FET mixer in response to the tuning voltage which normally controls the frequency of the local oscillator signals generated by the voltage controlled oscillator associated with the FET mixer and tends to track their amplitude variations to compensate for the amplitude variations of the local oscillator signals (see, for example, U.S. Pat. No. 3,976,944). Unfortunately, this approach is only a compromise solution since, as earlier noted, the conversion gain of an FET mixer is not only dependent on the bias point of the mixer but also the amplitudes of the local oscillator signals coupled to it.

SUMMARY OF THE PRESENT INVENTION

In a tuner including a voltage controlled oscillator for generating local oscillator signals having respective frequencies and amplitudes controlled in response to amplitudes of a tuning signal and a mixer, which may desirably include an FET, responsive to the local oscillator signals and RF signals coupled to the tuner to produce an IF signal, coupling means, desirably including a varactor diode having its capacitance controlled in response to the amplitudes of the tuning signal, is coupled to the local oscillator to control the amplitudes of the local oscillator signals so that the input signals to the mixer for at least two local oscillator frequencies within a predetermined band have at least approximately the same amplitude.

DETAILED DESCRIPTION OF THE DRAWING

In the television receiver of the sole FIGURE, RF signals in the VHF range received by a VHF antenna 12 are coupled to a VHF RF input unit 14 where they are filtered and amplified. The output of signals of VHF RF input unit 14 are coupled through a capacitor 16 to a mixer 18. Local oscillator signals generated by a VHF local oscillator 22 having frequencies appropriate for tuning the receiver channels in the VHF range, e.g., in the United States channels 2–13, are coupled through a capacitive network 20 to mixer 18. Mixer 18 combines the processed VHF RF and local oscillator signals to form an IF signal containing picture, color and sound signal components. The IF signal output of mixer 18 is coupled through a tuned circuit 24 to an IF amplifier 26. The output signal of IF amplifier 26 is coupled to a signal processing circuit 28 which processes the picture, color and sound signal components to form a visual response by means of a kinescope 30 and an audio response by means of a speaker 32.

RF signals in the UHF range, received by a UHF antenna 34, are coupled to a UHF tuner 36, are filtered, amplified and combined with local oscillator signals having frequencies appropriate for tuning the receiver to channels in the UHF range, e.g., in the United States channels 14–83, to form an IF signal. The output of UHF tuner 36 is coupled through a diode switch 38 and a capacitor 40 to mixer 18. When a channel in the UHF range has been selected, diode 38 is rendered conductive, and the IF output of UHF tuner 36 is coupled to mixer 18. In addition, when a channel in the UHF range has been selected, VHF RF unit 14 is disabled from coupling VHF RF signals to mixer 18 and VHF local oscillator 22 is disabled from generating VHF local oscillator signals. As a result, when a UHF channel has been selected, mixer 18 serves to amplify the IF signal generated by UHF tuner 36 and couple it to the remaining portion of the television receiver for processing in the same manner as the IF signal derived from the VHF RF signals.

In the receiver, a viewer may select a particular channel by means of a channel selection unit 42 which generates control signals representing the selected channel. The control signal is coupled to a tuning voltage unit 44 and to a bandswitching unit 46. Tuning unit 44 generates a DC tuning voltage TV having amplitudes corresponding to the selected channels to control the frequencies of the local oscillator signals generated by VHF local oscillator 22 and the local oscillator (not shown) within UHF tuner 36 and the frequency response of voltage tunable filters (not shown within VHF RF input unit 14 and UHF tuner 36. Bandswitching unit 46 generates an LV (Low VHF) bandswitching signal when the selected channel is between channels 2–6, a HV (High VHF) bandswitching signal when the selected channel is between channels 7–13 and a U (UHF) bandswitching signal when the selected channel is between channels 14–83. The bandswitching signals are utilized to enable (by their presence) and disable (by their absence) the operation of various tuning portions of the receiver as indicated in the FIGURE.

Local oscillator 22 is of the Colpitts type including an NPN transistor 48 arranged in a common base amplifier configuration and a frequency determining network 50 coupled to the collector of transistor 48. Frequency determining network 50 includes: inductors 52 and 54 and VHF bypass capacitor 56 connected in series between the collector of transistor 48 and signal ground; a switching diode 58 connected in series with a VHF bypass capacitor 60 between the junction point of inductors 52 and 54 and signal ground; a capacitor 62 coupled in parallel with switching diode 58; and a capacitor 64 and a varactor diode 66 connected in series between the collector of transistor 48 and signal ground so as to form a parallel tuned circuit with the series combination of inductors 52 and 54.

The band in which local oscillator 22 oscillates is controlled by controlling the conduction state of switching diode 58. Specifically, when a channel between 7-13 is selected, bandswitching unit 46 generates a HV bandswitching signal. In response, switching diode 58 is rendered conductive thereby effectively bypassing inductor 54 and capacitor 62. As a result, resonant frequencies of frequency network 50 are increased. Conversely, when a channel between 2-6 is selected, bandswitching unit 46 generates an LV bandswitching signal, switching diode 58 is rendered nonconductive and the resonant frequency of frequency network 50 is decreased. Furthermore, because more power is required by transistor 48 in the high VHF band than in the low VHF band, the bias voltage at the base of transistor 48 is increased when a channel between 7-13 is selected. Specifically, this is accomplished by proportioning resistors 68 and 70, which couple the substantially equal amplitude LV and HV bandswitching signals to the base of transistor 48, with respect to a bias resistor 72 connected between the base of transistor 48 and signal ground.

The particular frequency of oscillation of local oscillator 22 is controlled in response to the magnitude of tuning voltage TV. Specifically, tuning voltage TV, which is a positive voltage, is coupled to the cathode of varactor diode 66. Reverse biased varactor diode 66 exhibits a capacitance which decreases with increasing magnitudes of tuning voltage TV. As a result, the resonant frequencies of frequency determining network 50 and the frequencies of the local oscillator signals generated by local oscillator 22 increase with increasing magnitudes of tuning voltage. Unfortunately, because of the increased capacitance of varactor diode 66 at the low ends of the LV and HV bands, the amplitudes of the local oscillator signals at the low ends of the LV and HV bands are lower than the amplitudes of the local oscillator signals at the high ends of the LV and HV bands. The difference between the amplitudes of the local oscillator signals at the high and low ends of the LV band is much more pronounced than the difference between the amplitudes of the local oscillator signals at the high and low ends of the HV band because of the additional presence of capacitor 62 in the LV band (which is bypassed in by conductive switching diode 58 in the HV band). The substantial difference between the amplitudes of the local oscillator signals at the low and high ends in the LV band in particular presents a problem with respect to the conversion gain of mixer 18.

Mixer 18 includes a N-channel field effect transistor (FET) 74 because of the inherent nearly square law transfer characteristic associated with FETs when utilized as mixing devices to minimize undesired cross-modulation and intermodulation products. A source of positive supply voltage B+ is coupled through tuned circuit 24, which serves as the output load of FET 74, to the drain (D) electrode of FET 74. The source (S) electrode of FET 74 is coupled through a resistor 76 to signal ground. Resistor 76 is effectively shorted for signals in the IF range by bypass capacitor 78. Fixed bias voltages to establish the DC operating point of FET 74 are coupled to gate electrodes G1 and G2 by a voltage divider network 80 including resistors 82, 84 and 86 coupled in series between supply voltage B+ and signal ground. Gate electrode G1 is the input of mixer 18 and is coupled to the output of VHF RF input unit 14 through capacitor 16 and the output of local oscillator 22 through capacitance network 20.

In the United States, for example, the RF frequencies (83.25 MHz and 87.75 MHz) of the picture and the sound components associated with channel 6 may be combined with the frequency (129.00 MHz) of the local oscillator signal for channel 6 by a mixer having a transfer characteristic including an appreciable third order term (i.e., a term having an exponent of three) beyond the desired second order term to form a spurious signal component within the If passband (between 39.75 MHz and 47.25 MHz) near the IF frequency (42.17 MHz) of the color component (i.e., 83.25 MHz + 87.75 MHz − 129 MHz = 42.00 MHz) as well as other spurious signal components in the IF passband (e.g., 2 × 87.75 MHz − 129.00 MHz = 46.5 MHz) which tend to produce disconcerting visible beats in the picture commonly called channel 6 beats. Therefore, to inhibit the development of such channel 6 beats, the bias voltages coupled to gate electrodes G1 and G2 of FET 74 are selected with respect to the amplitude of the local oscillator signal for channel 6 so that the transfer characteristic of mixer 18 is most nearly a square law response substantially free of third and higher order terms. Fortuitously, under these bias and local oscillator amplitude conditions of FET 74, the conversion gain of mixer 18 is sufficiently large so as to provide nearly optimum performance. Unfortunately, the amplitudes of the local oscillator signals are significantly lower for lower channels for the reasons earlier discussed. As a result, the bias voltage and local oscillator amplitude combination for nearly optimum performance at channel 6 is not maintained for the lower channels. This undesirable situation is most pronounced at channel 2 because it has the local oscillator signal with the lowest amplitude.

While it has been suggested to alter the DC operating point of an FET mixer in response to the tuning voltage (which is directly related to the amplitudes of the local signals) to compensate for the lower amplitudes of the local oscillator signals at the lower channels, this solution does not maintain the desired operating point and mixer input signal, commonly referred to as the mixer injection voltage, combination for optimum performance. In the present arrangement, the desired DC operating point and the injection voltage combination is substantially maintained by means of capacitance network 20. Capacitance network 20 includes a capacitor 88, varactor diode 90 and capacitor 92 coupled in series between the output of local oscillator 22 at the collector of transistor 48 and to the input of mixer 18 at gate G1 of FET 74. Positive tuning voltage TV is coupled to the cathode of varactor 90 through a resistor 94. The anode of varactor 90 is coupled to signal ground through a resistor 96.

In operation, as the tuning voltage TV decreases in response to the selection of lower channels, the capacitance of back biased varactor diode 90 increases. As a result, although the amplitudes of the local oscillator signals are smaller for the lower channels than for the higher channels, the capacitance of capacitance network 20 is greater for the lower channels than for the higher channels, and the amplitudes of the mixer input signals or injection voltages and, as a result, the conversion gain for mixer 18, are maintained relatively constant throughout the VHF range.

Capacitors 88 and 92 limit the range of capacitance variations of capacitance network 20 which would otherwise have a range of capacitance variation equal to that of varactor diode 90. Desirably, varactor diode 90 and the values of capacitors 88 and 92 are selected so that the amplitude of the injection voltage at channel 2 is at least approximately equal to the amplitude of the injection voltage for channel 6. Under these conditions, the amplitude of injection voltages for channels in the midrange of the lower VHF band, i.e., for channels 3 and 4, will be slightly higher than the amplitudes of the injection voltages for channels 2 and 6 (which are approximately the same). This presents no real difficulty since there is no appreciable degradation of the conversion gain and square law response characteristics for amplitudes of injection voltage slightly higher than the desired amplitude of injection voltage at the desired DC operating point. Capacitors 88 and 92 also serve to prevent tuning voltage TV from being coupled to transistor 48 of local oscillator 22 and FET 24 of mixer 18, respectively, and thereby undesirably affecting their DC operating points. Since varactor diodes tend to have positive temperature coefficients, i.e., their capacitances tend to increase with increases in temperature, it is desirable that capacitors 88 and 92 be selected to have negative temperature coefficients so as to minimize as nearly as possible variations in the value of capacitance of capacitance network 20 due to temperature. Since ceramic disc capacitors have negative temperature coefficients, they are suitable for this purpose.

Listed below are various component values and part numbers for the circuit shown in the sole FIGURE which have been found to provide the desirable features of the present invention as set forth above when incorporated in a KRK-239 VHF tuner manufactured by RCA Corporation having a local oscillator and mixer similar to those shown in the sole FIGURE. A description of the KRK-239 tuner and other portions of a receiver suitable for use in the receiver arrangement of the FIGURE will be found in "RCA Television Service Data, File 1977 C-5", for the CTC-90 chassis series published by RCA Corporation, Indianapolis, Indiana, which is hereby incorporated by reference.

Transistor 48: Motorola MPSH 11
Inductor 52: 20 nanohenries
Inductor 54: 100 nanohenries
Capacitor 56: 82 picofarads
Switching Diode 58: ITT 244
Capacitor 60: 2000 picofarads
Capacitor 62: 5.6 picofarads
Capacitor 64: 47 picofarads
Varactor Diode 66: Siemens BB105
Resistor 68: 1800 ohms
Resistor 70: 1200 ohms
Resistor 72: 390 ohms
FET 74: Texas Instruments 3N211
Resistor 76: 820 ohms
Resistor 82: 1.8 megohms
Resistor 84: 910 kilohms
Resistor 86: 910 kilohms
Capacitor 88: 20 picofarads
Varactor Diode 90: Siemens BB105
Capacitor 92: 20 picofarads
Tuning Voltage Range: 1.5 VDC for channel 2 to 19 VDC for channel 6
B+: +18 VDC
HV: +18 VDC
LV: +18 VDC

WHAT IS CLAIMED IS:

1. In a system for tuning a receiver to radio frequency signals in response to respective amplitudes of a tuning signal generated when a user selects corresponding tuning positions, apparatus comprising:
    local oscillator means for generating at least a first local oscillator signal at a first frequency in response to a first amplitude of said tuning signal and a second local oscillator signal at a second frequency and having an amplitude substantially different than the amplitude of said first local oscillator signal in response to a second amplitude of said tuning signal;
    mixer means having an input and an output;
    first coupling means including a first varactor diode serially coupled between said local oscillator means in response to said second amplitude of said tuning signal, said second injection signal for developing at said input of said mixer means a first injection signal at said first frequency in response to said first amplitude of said tuning signal and a second injection signal at said second frequency and having an amplitude substantially equal to the amplitude of said first injection signal; and
    second coupling means for coupling said radio frequency signals to said input of said mixer;
    said mixer means combining said radio frequency signals and said injection signals to develop an intermediate frequency signal at said output thereof.

2. The apparatus recited in claim 1 wherein:
    said local oscillator means includes an amplifier, a second varactor diode coupled to said amplifier to form an oscillator configuration, and second means for controlling the capacitance of said second varactor diode in response to the amplitudes of said tuning signal so that the frequencies and amplitudes of said local oscillator signals are inversely related to the capacitance of said second varactor diode;
    said first means and said second means coupling said tuning signal to said first and second varactor diodes so that the capacitances thereof are greater in response to said second amplitude of said tuning signal than in response to said first amplitude of said tuning signal.

3. The apparatus recited in claim 2 wherein:
    said mixer means includes a field effect transistor, and means to bias said field effect transistor at an operating point where it exhibits a substantially square law transfer characteristic in response to said first injection signal.

4. The apparatus recited in claim 3 wherein:
    said first coupling means includes a first capacitor coupled in series between said first varactor diode and said input of said mixer.

5. The apparatus recited in claim 4 wherein:
    said first coupling means includes a second capacitor coupled in series between said first varactor diode and said local oscillator means.

6. The apparatus recited in claim 5 wherein:
    at least one of said first and second capacitors has a negative temperature coefficient.

* * * * *

UNITED STATES PATENT AND TRADEMARK OFFICE
CERTIFICATE OF CORRECTION

PATENT NO. : 4,160,213
DATED : July 3, 1979
INVENTOR(S) : George William Carter

It is certified that error appears in the above-identified patent and that said Letters Patent is hereby corrected as shown below:

In column 5, line 30, after "purpose" delete "90". In claim 1, change the paragraph beginning "first coupling means..." from "first coupling means including a first varactor diode serially coupled between said local oscillator means in response to said second amplitude of said tuning signal, said second injection signal for developing at said input of said mixer means a first injection signal at said first frequency in response to said first amplitude of said tuning signal and a second injection signal at said second frequency and having an amplitude substantially equal to the amplitude of said first injection signal; and" to --first coupling means including a first varactor diode serially coupled between said local oscillator means and said mixer means and responsive to said tuning signal for developing at said input of said mixer means a first injection signal at said first frequency in response to said first amplitude of said tuning signal and a second injection signal at said second frequency in response to said second amplitude of said tuning signal, said second injection signal having an amplitude substantially equal to the amplitude of said first injection signal; and--

Signed and Sealed this

Twenty-sixth Day of February 1980

[SEAL]

Attest:

SIDNEY A. DIAMOND

Attesting Officer

Commissioner of Patents and Trademarks